United States Patent [19]
Luft

[11] Patent Number: 6,044,101
[45] Date of Patent: Mar. 28, 2000

[54] SEMICONDUCTOR LASER DEVICE

[75] Inventor: Johann Luft, Wolfsegg, Germany

[73] Assignee: Siemens Aktiengesellschaft, Munich, Germany

[21] Appl. No.: 09/032,699

[22] Filed: Mar. 2, 1998

Related U.S. Application Data

[63] Continuation of application No. PCT/DE96/01576, Aug. 23, 1996.

[30] Foreign Application Priority Data

Aug. 29, 1995 [DE] Germany ............................. 195 31 755

[51] Int. Cl.$^7$ ...................................................... H01S 3/085
[52] U.S. Cl. ................................................ 372/46; 352/50
[58] Field of Search ................................... 372/45, 46, 50, 372/44, 43

[56] References Cited

U.S. PATENT DOCUMENTS

| | | | |
|---|---|---|---|
| 4,674,095 | 6/1987 | Heinen et al. | 372/50 |
| 4,712,220 | 12/1987 | Luft | 372/50 |
| 4,792,200 | 12/1988 | Amann et al. | 350/96.12 |
| 5,063,570 | 11/1991 | Botez et al. | 372/50 |

FOREIGN PATENT DOCUMENTS

| | | |
|---|---|---|
| 0156014A2 | 10/1985 | European Pat. Off. . |
| 0221258A1 | 5/1987 | European Pat. Off. . |
| 0292029A1 | 11/1988 | European Pat. Off. . |
| 4036000C2 | 9/1993 | Germany . |

OTHER PUBLICATIONS

"Low–noise and high–power real refractive index guided laser array", T. Takayama et al., Electronics Letters, 4$^{th}$ Aug. 1994, vol. 30, No. 16, pp. 1307–1308.

"Regular integrated array of stripe injection lasers", V.I. Malakhova et al., Sov. J. Quantum Electron. 11(10), Oct. 1981, pp. 1351–1352.

"Index–guided arrays of Schottky barrier confined lasers", H. Temkin et al., Appl. Phys. Lett. 46(5), Mar. 1, 1985, pp. 465–466.

*Primary Examiner*—James W. Davie
*Attorney, Agent, or Firm*—Herbert L. Lerner; Laurence A. Greenberg; Werner H. Stemer

[57] ABSTRACT

A semiconductor laser device having a multiplicity of individual lasers disposed in a laser-active region within outer boundary surfaces having front and rear boundary surfaces extending crosswise to an exit direction of the laser light, and lateral, bottom and top boundary surfaces extending parallel to the exit direction of the laser light, includes an absorption layer for decoupling photons interfering with desired laser operation, the absorption layer being applied full-surface to all of the outer boundary surfaces of the laser device, except for the laser-active region for at least one of the front and the rear boundary surfaces, respectively, extending crosswise to the exit direction of the laser light, and except for a relatively few locations remaining free for disposing terminal electrodes thereon or for introducing pump light thereat.

4 Claims, 1 Drawing Sheet

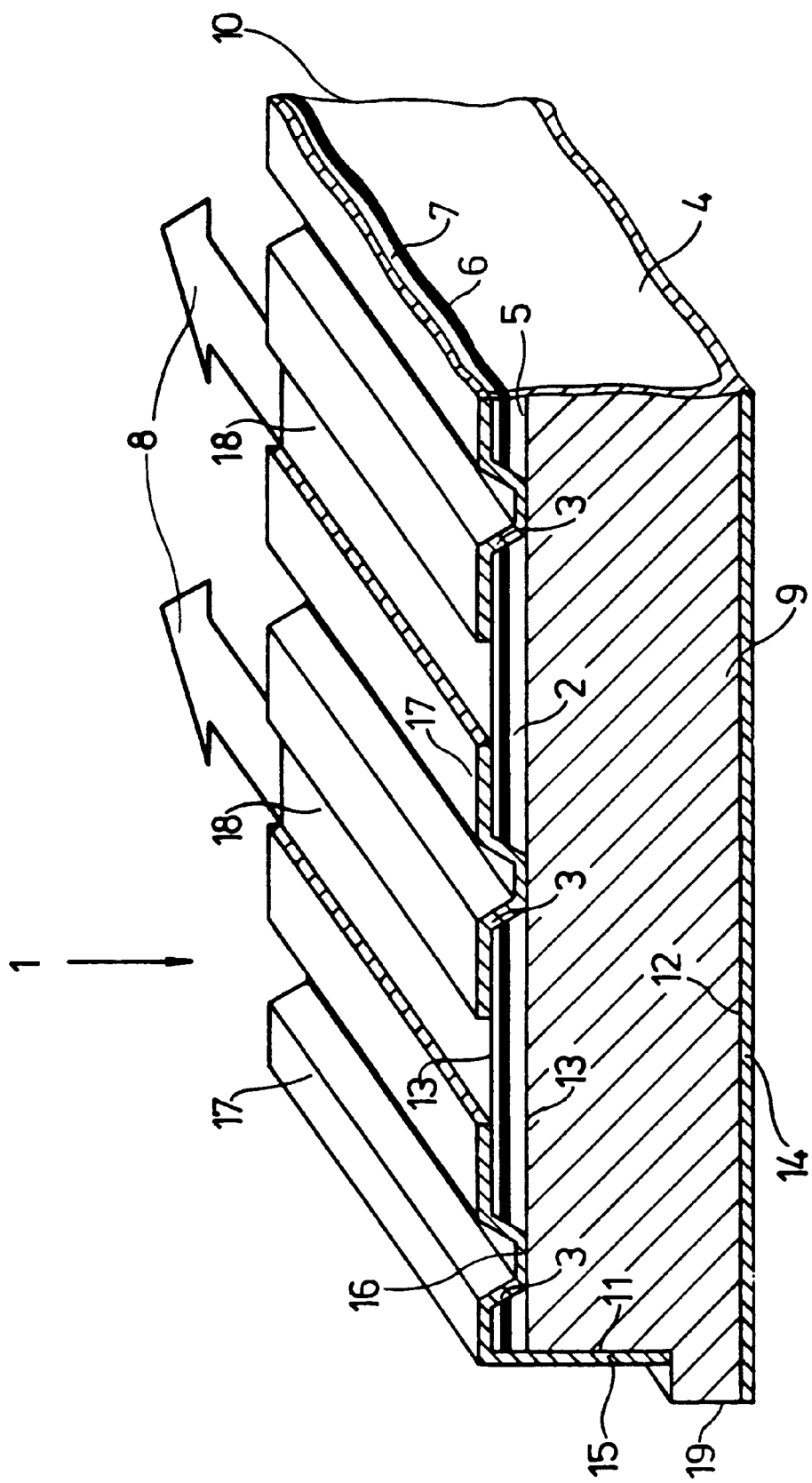

SEMICONDUCTOR LASER DEVICE

CROSS-REFERENCE TO RELATED APPLICATION

This application is a continuation of international application Serial No. PCT/DE96/01576, filed Aug. 23, 1996, which designated the United States.

BACKGROUND OF THE INVENTION

FIELD OF THE INVENTION

The invention relates to a semiconductor laser device having a multiplicity of individual lasers disposed in a laser-active region within outer boundary surfaces, including front and rear boundary surfaces extending crosswise to an exit direction of the laser light, and lateral, bottom and top boundary surfaces extending parallel to the exit direction of the laser light.

In laser diodes, and particularly in high-power laser diodes, the appearance of low-loss internal ring modes, or other concurrence modes, which sometimes interfere considerably with the desired laser operation and which as a rule are induced by spontaneously emitted photons, superluminescence or scattered laser radiation, leads to an impairment in overall efficiency of the laser diodes. The influence of such problems occurs particularly for short resonator lengths (such as less than about 300 $\mu$m and/or at a provided front-sided dereflection layer, particularly in products wherein the mirror reflections $R_{front} \cdot R_{back}$ are less than approximately 0.30). This problem has been made even worse with the increasing improvement in the epitaxial layers used in semiconductor laser devices to form the laser-active regions, because the internal absorption and scattering losses of the boundary layers are even lower. In this respect, it has become known heretofore from the literature in Appl. Phys. Lett. 52 (16) pp. 1320 ff., 1988, that quite a considerable proportion of the degradation mechanisms is photon-induced, especially in GaAs/AlGaAs semiconductor laser diodes. For this reason, the interfering photons mentioned are also definitively involved in the aging of the laser diode.

In laser diodes with wide active regions and therefore a great tendency to the aforementioned vulnerability to interference or malfunction, the active region is split by dividing trenches into a multiplicity of narrower active regions. In laser diodes with relatively wide individual regions (for example, 40 laser strips with a total width of 400 $\mu$m) or short resonator lengths and/or mirror reflections with $R_{front} \cdot R_{back} \leq 0.30$, this provision is generally no longer adequate. In multilaser arrays, the problem has therefore been countered in the past in such a way that the lateral boundaries of the laser-active region, embodied as V-shaped trenches, were provided with a material which absorbs or decouples the undesired transverse or ring modes of the laser radiation (note the published European Patent Document EP-A 221 285 B1). If the laser mirror coating were selected so that $R_{front} \cdot R_{back} \geq 0.3$, then the absorptive property of, for example, a titanium coating or also a chromium coating in the etched lateral dividing trenches sufficed to suppress the competing modes.

Other multilayer arrays have been disclosed, for example, in U.S. Pat. No. 4,792,200 or U.S. Pat. No. 5,063,570.

With the invention, all the photons which in any way interfere with the desired laser operation are eliminated entirely or at least in part, with the goal of improving all the essential characteristic laser properties, such as threshold current, differential steepness or gradient, mirror destruction or disruption limit, spectral mode behavior, and aging.

SUMMARY OF THE INVENTION

It is accordingly an object of the invention to provide a semiconductor laser device with many individual lasers disposed in a laser-active region, wherein all of the essential characteristic laser properties are improved over corresponding prior-art devices.

With the foregoing and other objects in view, there is provided, in accordance with the invention, a semiconductor laser device having a multiplicity of individual lasers disposed in a laser-active region within outer boundary surfaces, including front and rear boundary surfaces extending crosswise to an exit direction of the laser light, and lateral, bottom and top boundary surfaces extending parallel to the exit direction of the laser light, comprising an absorption layer for decoupling photons interfering with desired laser operation, the absorption layer being applied full-surface to all of the outer boundary surfaces of the laser device, except for the laser-active region for at least one of the front and the rear boundary surfaces, respectively, extending crosswise to the exit direction of the laser light, and except for a relatively few locations remaining free for disposing terminal electrodes thereon or for introducing pump light thereat.

In accordance with another feature of the invention, the laser-active region has lateral boundaries formed by trench-like indentations wherein the absorption layer is applied.

In accordance with a further feature of the invention, the individual lasers disposed in the laser-active region within the outer boundary surfaces are semiconductor lasers disposed striplike adjacent to one another on a semiconductor substrate.

In accordance with a concomitant feature of the invention, the individual lasers are phase-coupled laser diodes.

Suitable materials for the absorption layer include, for example, semiconductor materials, dielectric materials, metal oxides, metals and plastic materials with properties exhibiting the described effects on the interfering photons, such materials being applicable to the outer boundary faces of the laser device by vapor deposition, epitaxial sputtering, electroplating, and spin-on or other techniques.

The laser device according to the invention is preferably used in a multilayer arrangement, i.e., a laser array, with phase-coupled laser diodes, namely semiconductor laser diodes, within a laser-active region.

Other features which are considered as characteristic for the invention are set forth in the appended claims.

Although the invention is illustrated and described herein as embodied in a semiconductor laser device, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying single FIGURE of a drawing; wherein:

BRIEF DESCRIPTION OF THE DRAWINGS

The FIGURE is a top, front and side perspective view, partly in section and partly broken away, of a semiconductor laser device constructed in accordance with the invention.

DESCRIPTION OF THE PREFERRED EMBODIMENTS

Referring now to the single FIGURE of the drawing, there is shown therein a laser array 1 having a number of phase-coupled individual laser diodes, disposed in a laser-active region 2, which are subdivided from one another by trench-like indentations 3 formed by etching or sawing. The laser array 1 includes a semiconductor substrate 4 of GaAs and epitaxial layers 5, 6 and 7 applied thereon. Laser radiation 8 is emitted from the laser-active region 2 of the laser array 1.

The laser array 1 of the drawing also has outer boundary surfaces including front and rear boundary surfaces 9 and 10 extending crosswise to the exit direction of the laser light 8, and lateral boundary surfaces extending parallel to the exit direction of the laser light 8, only the left-hand lateral boundary surface 11 of the lateral boundary surfaces being shown in the drawing, as well as lower and upper boundary surfaces 12 and 13. According to the invention, at least one outer boundary surface of the laser device 1 is provided with an absorption layer 14 to 17 applied over virtually the entire surface. The absorption layer 14 to 17 is formed of a material which reduces reflection and/or is absorptive of the laser light and/or has an index of refraction which matches that of the material of the laser-active region 2. A suitable material for the absorption layer 14 to 17 is a semiconductor material, a dielectric material, a metal oxide, a metal, or a plastic material having the aforedescribed effects upon the interfering photons. These materials may be vapor-deposited, sputtered on, epitaxially applied, electroplated, spun on, or applied externally in some other suitable manner. For use as a high-power laser diode, the material of the absorption layer 14 to 17, in particular, has germanium or silicon therein.

In the exemplary embodiment shown in the drawing, all of the outer boundary surfaces 9 to 13 are provided with the absorption layer 14 to 17 which, with the exception of the laser-active region 2 and the places indicated by reference numerals 18 and 19, at which terminal electrodes or other contacts are to be provided or pump light for the laser device is introduced, is applied full-surface on and following the surface contour of the outer boundary surfaces.

I claim:

1. A semiconductor laser device having a multiplicity of individual lasers disposed in a laser-active region within outer boundary surfaces, including front and rear boundary surfaces extending crosswise to an exit direction of the laser light, and lateral, bottom and top boundary surfaces extending parallel to the exit direction of the laser light, comprising an absorption layer for decoupling photons interfering with desired laser operation, said absorption layer being applied full-surface to all of the outer boundary surfaces of the laser device, except for the laser-active region for at least one of the front and the rear boundary surfaces, respectively, extending crosswise to the exit direction of the laser light, and except for a relatively few locations remaining free for disposing terminal electrodes thereon or for introducing pump light thereat.

2. The laser device according to claim 1, wherein the laser-active region has lateral boundaries formed by trench-like indentations wherein said absorption layer is applied.

3. The laser device according to claim 1, wherein the individual lasers disposed in the laser-active region within the outer boundary surfaces are semiconductor lasers disposed striplike adjacent to one another on a semiconductor substrate.

4. The laser device according to claim 3, wherein the individual lasers are phase-coupled laser diodes.

* * * * *